US011450469B2

(12) United States Patent
Lambkin et al.

(10) Patent No.: US 11,450,469 B2
(45) Date of Patent: Sep. 20, 2022

(54) INSULATION JACKET FOR TOP COIL OF AN ISOLATED TRANSFORMER

(71) Applicant: Analog Devices Global Unlimited Company, Hamilton (BM)

(72) Inventors: Paul Lambkin, Carrigaline (IE); Patrick J. Murphy, Patrickswell (IE); Bernard Patrick Stenson, Manister (IE); Laurence B. O'Sullivan, Ballinacurra (IE); Stephen O'Brien, Clarina (IE); Shane Geary, Sixmilebridge (IE); Baoxing Chen, Westford, MA (US); Sombel Diaham, Villeneuve les Bouloc (FR)

( * ) Notice: Subject to any disclaimer, the term of this patent is extended or adjusted under 35 U.S.C. 154(b) by 337 days.

(21) Appl. No.: 16/553,954

(22) Filed: Aug. 28, 2019

(65) Prior Publication Data

US 2021/0065955 A1 Mar. 4, 2021

(51) Int. Cl.
*H01F 19/08* (2006.01)
*H04B 1/04* (2006.01)
*H04B 1/16* (2006.01)
*H01G 2/00* (2006.01)

(52) U.S. Cl.
CPC ....... *H01F 19/08* (2013.01); *H01F 2019/085* (2013.01); *H01G 2/00* (2013.01); *H04B 1/04* (2013.01); *H04B 1/16* (2013.01)

(58) Field of Classification Search
None
See application file for complete search history.

(56) References Cited

U.S. PATENT DOCUMENTS

| 5,354,695 | A | 10/1994 | Leedy |
| 5,512,774 | A | 4/1996 | Nakagawa et al. |
| 5,684,660 | A | 11/1997 | Gray et al. |
| 5,969,590 | A | 10/1999 | Gutierrez |
| 6,448,536 | B2 | 9/2002 | Li et al. |

(Continued)

FOREIGN PATENT DOCUMENTS

| CN | 101142715 A | 3/2008 |
| CN | 103715211 A | 4/2014 |

(Continued)

OTHER PUBLICATIONS

PCT/IB2017/001472, Feb. 14, 2018, International Search Report and Written Opinion.

(Continued)

*Primary Examiner* — Jared Fureman
*Assistant Examiner* — Aqeel H Bukhari
(74) *Attorney, Agent, or Firm* — Wolf, Greenfield & Sacks, P.C.

(57) ABSTRACT

A micro-isolator is described. The micro-isolator may include a first isolator element, a second isolator element, and a first dielectric material separating the first isolator element from the second isolator element. A second dielectric material may completely or partly encapsulate the second isolator element, or may be present at outer corners of the second isolator element. The second dielectric material may have a larger bandgap than the first dielectric material, and its configuration may reduce electrostatic charge injection into the first dielectric material. The micro-isolator may be formed using microfabrication techniques.

20 Claims, 11 Drawing Sheets

(56) References Cited

U.S. PATENT DOCUMENTS

| | | |
|---|---|---|
| 6,512,437 B2 | 1/2003 | Jin et al. |
| 6,927,662 B2 | 8/2005 | Kahlmann et al. |
| 7,282,789 B2 | 10/2007 | Kinsman |
| 7,489,526 B2 | 2/2009 | Chen et al. |
| 7,545,059 B2 | 6/2009 | Chen et al. |
| 7,741,943 B2 | 6/2010 | Fouquet et al. |
| 7,856,219 B2 | 12/2010 | Dupuis |
| 7,902,627 B2 | 3/2011 | Dong et al. |
| 7,923,710 B2 | 4/2011 | Crawley et al. |
| 7,947,600 B2 | 5/2011 | Iwaya et al. |
| 8,061,017 B2 | 11/2011 | Fouquet et al. |
| 8,064,872 B2 | 11/2011 | Dupuis |
| 8,237,534 B2 | 8/2012 | Fouquet et al. |
| 8,446,243 B2 | 5/2013 | Strzalkowski et al. |
| 8,569,861 B2 | 10/2013 | O'Donnell et al. |
| 8,614,616 B2 | 12/2013 | Willkofer et al. |
| 8,643,138 B2 | 2/2014 | Dong |
| 8,742,539 B2 | 6/2014 | Weyers et al. |
| 9,105,391 B2 | 8/2015 | Fouquet et al. |
| 9,318,784 B2 | 4/2016 | Sin et al. |
| 9,380,705 B2 | 6/2016 | Chen |
| 9,496,926 B2 | 11/2016 | Bhamidipati et al. |
| 9,508,485 B1 | 11/2016 | Vinciarellu |
| 9,735,112 B2 | 8/2017 | Constantino et al. |
| 9,761,545 B2 | 9/2017 | Sin et al. |
| 9,812,389 B2 | 11/2017 | Ho et al. |
| 9,893,008 B2 | 2/2018 | Bonifield et al. |
| 9,929,038 B2 | 3/2018 | O'Sullivan |
| 10,074,939 B1 | 9/2018 | Briano |
| 10,121,847 B2 | 11/2018 | Cook et al. |
| 11,044,022 B2 | 6/2021 | O'Sullivan et al. |
| 2001/0000303 A1 | 4/2001 | Sasaki |
| 2003/0042571 A1 | 3/2003 | Chen et al. |
| 2004/0060164 A1 | 4/2004 | Wan et al. |
| 2004/0101226 A1 | 5/2004 | Zbinden |
| 2005/0024176 A1 | 2/2005 | Wang et al. |
| 2006/0226924 A1 | 10/2006 | Chen et al. |
| 2008/0080624 A1 | 4/2008 | Feldtkeller |
| 2008/0258561 A1 | 10/2008 | Mercer |
| 2008/0277761 A1 | 11/2008 | Mahalingam et al. |
| 2008/0311862 A1 | 12/2008 | Spina et al. |
| 2009/0230776 A1 | 9/2009 | Ochi et al. |
| 2010/0147215 A1 | 6/2010 | Baumann et al. |
| 2011/0095620 A1 | 4/2011 | Fouquet et al. |
| 2013/0027170 A1 | 1/2013 | Chen |
| 2013/0154071 A1 | 6/2013 | Haigh et al. |
| 2014/0145301 A1 | 5/2014 | Moghe et al. |
| 2014/0252533 A1 | 9/2014 | O'Sullivan |
| 2015/0069572 A1 | 3/2015 | Khanolkar et al. |
| 2015/0171934 A1* | 6/2015 | Brauchler ............... H01L 25/50 455/41.1 |
| 2015/0200162 A1 | 7/2015 | Constantino et al. |
| 2015/0357113 A1 | 12/2015 | Scholz |
| 2016/0197059 A1 | 7/2016 | Lin et al. |
| 2017/0117084 A1* | 4/2017 | Murphy ................. H01B 19/04 |
| 2018/0130867 A1 | 5/2018 | Lambkin et al. |
| 2018/0226391 A1 | 8/2018 | Ueki |
| 2019/0109233 A1 | 4/2019 | Tellkamp et al. |
| 2019/0123040 A1 | 4/2019 | Fukahori |
| 2019/0206812 A1 | 7/2019 | Bonifield et al. |
| 2019/0222112 A1 | 7/2019 | Sakai |
| 2020/0076512 A1 | 3/2020 | O'Sullivan et al. |
| 2021/0167169 A1 | 6/2021 | Tanghe et al. |

FOREIGN PATENT DOCUMENTS

| | | |
|---|---|---|
| CN | 203554302 U | 4/2014 |
| CN | 104022113 A | 9/2014 |
| CN | 104838458 A | 8/2015 |
| CN | 106611741 A | 5/2017 |
| CN | 206602009 U | 10/2017 |
| CN | 107919868 A | 4/2018 |
| EP | 1 990 914 A2 | 11/2008 |
| EP | 2 958 144 A1 | 12/2015 |
| EP | 3 159 946 A1 | 4/2017 |
| JP | 2004-229406 A | 8/2004 |
| TW | 200614290 A | 5/2006 |
| TW | 201442146 A | 11/2014 |
| TW | 201608902 A | 3/2016 |
| TW | 201639426 A | 11/2016 |
| TW | 201727870 A | 8/2017 |

OTHER PUBLICATIONS

U.S. Appl. No. 16/700,370, filed Dec. 2, 2019, Tanghe et al.

International Search Report and Written Opinion dated Feb. 14, 2018 in connection with International Application No. PCT/IB2017/001472.

Chen, Isolation in Digital Power Supplies Using Micro-Transformers. IEEE. 2009; 2039-2042.

Chen, Fully Integrated Isolated DC-DC Converter Using Micro-Transformers. IEEE. 2008; 335-338.

Krakauer, Balancing the Major Elements of an Isolator for Safety's Sake. Analog Devices. Technical Article MS-2576. 2014; 4 pages.

Lumio, Applicability of CMOS Digital Isolators in Variable-Frequency Drives. Thesis submitted for Master of Science in Technology. Aalto University School of Electrical Engineering. Jan. 1, 2016. 80 pages.

Extended European Search Report dated May 10, 2021 in connection with European Application No. 20209202.9.

* cited by examiner

INSULATION JACKET FOR TOP COIL OF AN ISOLATED TRANSFORMER

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits may or may not operate at different voltages than each other, but are referenced to different electrical ground potentials. Isolators can be used to electrically isolate circuits in either of these situations. Connecting multiple isolators in series may increase the amount of isolation between the circuits.

BRIEF SUMMARY

A micro-isolator is described. The micro-isolator may include a first isolator element, a second isolator element, and a first dielectric material comprising a polymer disposed between the first isolator element from the second isolator element. A second dielectric material may fully or partly encapsulate the second isolator element. The second dielectric material may be configured to reduce electrostatic charge injection into the first dielectric material. The micro-isolator may be formed using microfabrication techniques.

In some embodiments, a micro-isolator with enhanced isolation voltage is provided. The micro-isolator comprises a first isolator element, a second isolator element and a first dielectric material disposed between the first and second isolator elements. The micro-isolator further comprises a second dielectric material disposed at outer corners of the second isolator element.

In some embodiments, a micro-isolator with enhanced isolation voltage is provided. The micro-isolator comprises a first isolator element, a second isolator element and a first dielectric material disposed between the first and second isolator elements. The micro-isolator further comprise a second dielectric material encapsulating first isolator element, wherein the second dielectric material does not extend laterally beyond a maximum lateral dimension of the first isolator element.

In some embodiments, an isolation system is provided. The isolation system comprises a transmission circuit. The isolation system further comprises at least one micro-isolator coupled to the transmission circuit, the micro-isolator including a first isolator element, a second isolator element, a first dielectric material between the first and second isolator elements and a second dielectric material disposed at outer corners of the first isolator element, the second dielectric material having a wider bandgap than the first dielectric material. The isolation system further comprises a receive circuit coupled to the at least one micro-isolator.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
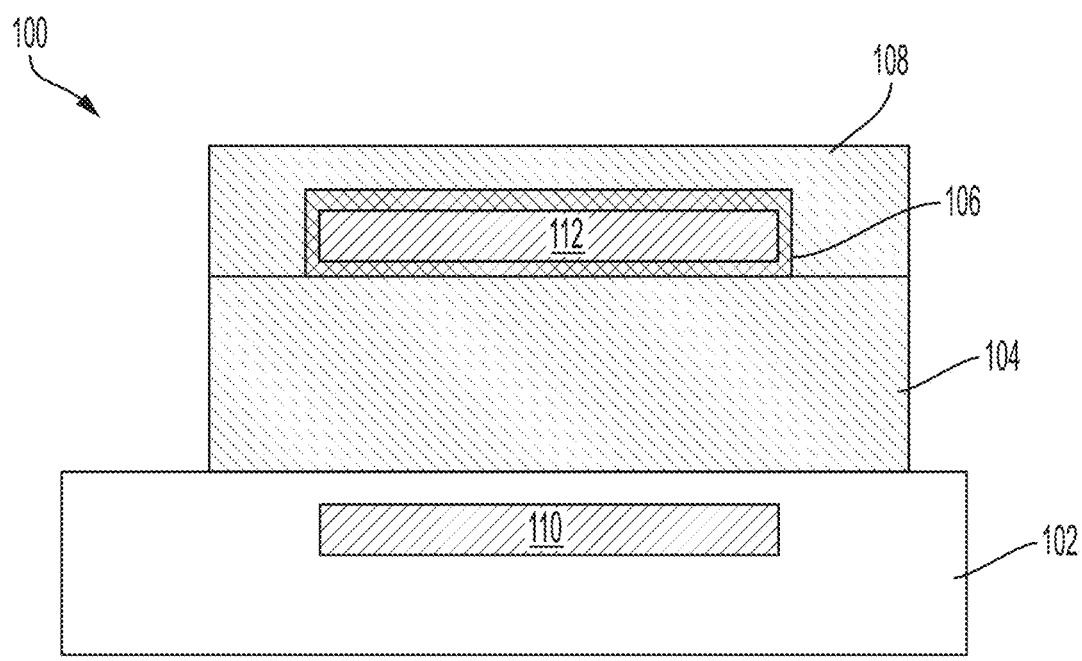
FIG. 1 illustrates a schematic view of an isolator having two isolator elements separated by a first dielectric material, with one of the isolator elements being encapsulated by a second dielectric material, in accordance with some embodiments.

Micro-isolators provide electronic isolation between microelectronic circuitry components. Some applications of microelectronic circuitry require signal communication between components operating within different high and low voltage domains. Other applications of microelectronic circuitry require electronic isolation between circuitry components as a means to prevent high voltages from propagating in the case that the circuitry develops a fault. Micro-isolators are used to electrically isolate a first circuit, which may be a microelectronic circuit, operating in a relatively high voltage domain, from a second circuit, which may be a microelectronic circuit, operating in a relatively low voltage domain, or to electrically isolate circuits as a matter of safety. An isolation barrier between the two circuits prevents undesirable voltage cross-over, and the micro-isolator provides signal communication across the isolation barrier.

Micro-isolators are often given a rating called the breakdown voltage. When the difference in voltage between the circuitry operating in the different voltage domains exceeds the breakdown voltage of the micro-isolator, the dielectric material between the micro-isolator components may exhibit electrical breakdown and become electrically conductive. It is thus desirable to increase the breakdown voltage of a micro-isolator.

According to an aspect of the present technology, an isolator exhibiting increased breakdown voltage is provided. The isolator includes an isolator element such as a coil or capacitive plate configured to be connected to a high voltage, with the isolator element being encapsulated in a dielectric material with a wide bandgap. The isolator may further comprise another dielectric material disposed between the coil and a second coil of the isolator. The wide bandgap material may be positioned to prevent creation of a triple point junction between the isolator element and surrounding dielectric materials. In some embodiments, the second isolator element may also be at least partially encapsulated by a wide bandgap material.

According to another aspect of the present technology, an isolator exhibiting increased breakdown voltage is provided. The isolator includes an isolator element such as a coil or capacitive plate configured to be connected to a high voltage, with the isolator element having outermost corners and a wide bandgap dielectric material disposed at said outermost corners. The isolator may further comprise another dielectric material between the coil and a second coil of the isolator. The wide bandgap material may be positioned to prevent creation of a triple point junction between the isolator element and surrounding dielectric materials. In some embodiments, the second isolator element may also be at least partially encapsulated by wide bandgap material.

According to another aspect of the present technology, there is provided an isolator system exhibiting increased breakdown voltage. The isolator system includes the isolator device of the first or second aspects. The isolator system may further comprise a transmission circuit coupled to a first isolation element of the isolator device. The isolator system may also further comprise a receive circuit coupled to a second isolation element of the isolator device disposed across an isolation barrier from the first isolation element. In some embodiments, both isolator elements may be at least partially encapsulated by wide bandgap material.

As described above, according to an aspect of the present application, an isolator is provided for isolating two circuits, the isolator including an isolator element encapsulated by a wide bandgap material. FIG. 1 is a non-limiting example showing a cross-sectional view of micro-isolator device 100 formed on a substrate 102, which may be a semiconductor substrate (e.g., a silicon substrate), such as a semiconductor die, or any other suitable material. The micro-isolator device 100 includes a first isolator element 110 disposed in the substrate 102. A first dielectric material 104 is positioned between the substrate 102 and a second dielectric material 106, which encapsulates a second isolator element 112. The first dielectric material 104 may provide galvanic isolation to reduce or prevent entirely current flow between the first isolator element 110 and the second isolator element 112.

The first dielectric material 104 may comprise one or more layers. Another dielectric layer 108 may be disposed above the second dielectric material 106 and the second isolator element 112, and may serve as a passivation layer or protective layer in at least some embodiments.

In the illustrated example, the isolator elements 110 and 112 are formed in two layers of the micro-isolator device 100, with first isolator element 110 formed in the substrate 102 and second isolator element 112 formed above first dielectric material 104. In some embodiments, the micro-isolator 100 may be a capacitive isolator configured to provide communication through capacitive coupling between capacitive plates, with isolator elements 110 and 112 being capacitive plates. The isolator elements may be one of various types, may be formed of various materials, assume various locations, and may be included in any suitable number. In some embodiments, the micro-isolator may be an inductive isolator configured to provide communication through inductive coupling between inductive coils, with isolator elements 110 and 112 being inductive coils. Although one micro-isolator is shown in FIG. 1, it should be appreciated that multiple micro-isolators may be formed in the same device package.

The first dielectric material 104 may provide a desired level of galvanic isolation between isolator elements 110 and 112 while allowing for electrical signal coupling (e.g. inductive coupling, capacitive coupling) between isolator elements 110 and 112 to occur. To allow for coupling to occur, isolator elements 110 and 112 may be positioned in relatively close proximity. One or more characteristics (e.g. material, thickness) of first dielectric material 104 may allow for galvanic isolation in addition to coupling between isolator elements 110 and 112. Examples of suitable materials for the first dielectric material 104 include one or more polyimides. The thickness of the first dielectric material 104 may be in the range of 0.1 microns to 1 microns, or any value or range of values in that range, as non-limiting examples.

The performance of the micro-isolator device 100 may be impacted by electrostatic charge injection into first dielectric material 104 while isolator elements 110 and 112 operate under a DC voltage bias. Second dielectric material 106 may act as a charge injection barrier to prevent the formation of a triple point junction, formed by a boundary between a metal and two different dielectric materials. Preventing the formation of a triple point junction may prevent the emission of large electric fields into first dielectric material 104 from isolator element 112. One or more characteristics (e.g. material, thickness, position) of second dielectric material 106 may prevent electrostatic charge injection into first dielectric material 104.

Second dielectric material 106 may assume any suitable configuration to prevent the formation of a triple point junction. In the non-limiting example shown, second dielectric material 106 may encapsulate, or substantially encapsulate the second isolator element 112 in order to prevent the formation of a triple point junction. In some embodiments, substantial encapsulation may include covering greater than 95% of the surface area of the isolator element, greater than 90% of the surface area of the isolator element, or greater than 85% of the surface area of the isolator element. However, other configurations of second dielectric material 106 are possible, some non-limiting examples of which are illustrated in subsequent figures. Second dielectric material 106 may extend across the entirety of first dielectric material 104 or it may only be disposed beneath second isolator element 112. Second dielectric material 106 may have any suitable thickness which may prevent electrostatic charge injection into first dielectric material 104. For example, second dielectric material 106 may have a thickness in the range of 0.1 um to 1 um, or in the range of 0.1 um to 5 um, or any value or range of values within those ranges.

Second dielectric material 106 may comprise any suitable material which may prevent electrostatic charge injection into first dielectric material 104. For example, in some embodiments, second dielectric material 106 may be a material with a bandgap wider than the bandgap of first dielectric material 104. In some embodiments, second dielectric material 106 may be a material with a bandgap wider than 5.0 eV, some non-limiting examples of which include silicon nitride, $SiO_2$, and $Al_2O_3$.

Second dielectric material 106 may have a another dielectric layer 108 disposed above second dielectric material 106. Dielectric layer 108 may protect second dielectric material 106 and isolator element 112 from environmental harm. In some embodiments, dielectric layer 108 may be composed of the same material as first dielectric material 104. In some embodiments, dielectric layer 108 is composed of a different material than first dielectric material 104 or second dielectric material 106, some non-limiting examples of which include $Si_3N_4$, $SiO_2$, $Al_2O_3$, and/or $TaO_5$.

Figure 2:
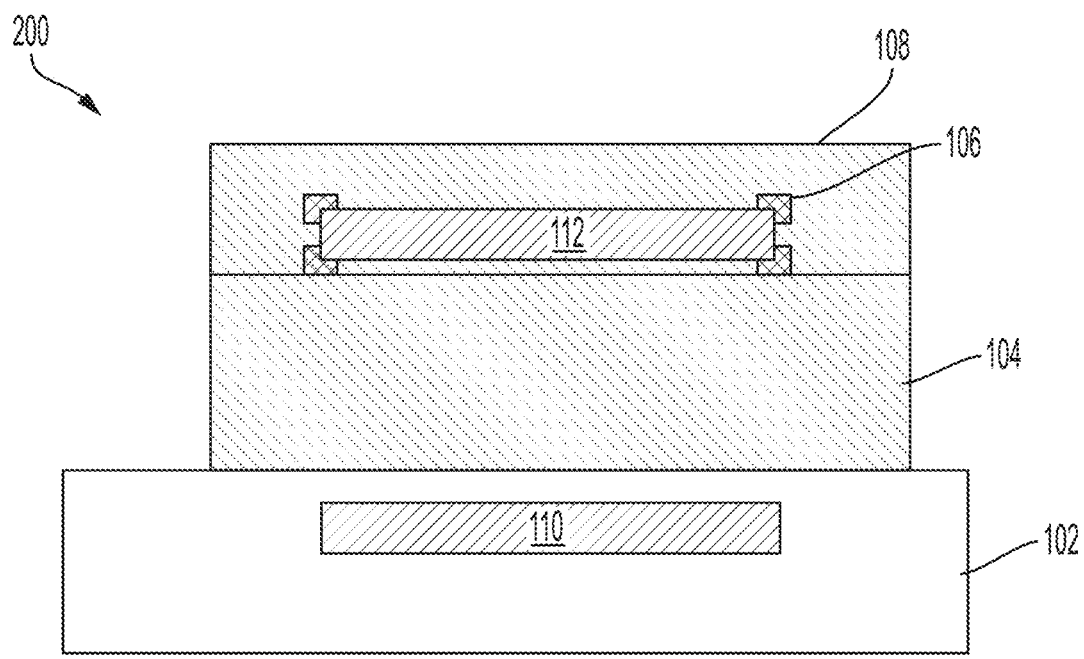
FIG. 2 illustrates a schematic view of an isolator having two isolator elements separated by a first dielectric material, with one of the isolator elements having corners covered by a second dielectric material, in accordance with some embodiments.

According to an aspect of the present application, a micro-isolator comprises two different dielectrics between the isolator elements, with one dielectric being positioned at outer corners of a second isolator element. FIG. 2 is a non-limiting example, and differs from micro-isolator 100 of FIG. 1 in that the second dielectric material 106 is disposed only at the corners of second isolator element 112 rather than encapsulating all of second isolator element 112. Positioning second dielectric material 106 only at the corners of second isolator element 112 may prevent the formation of a triple point junction and reduce electrostatic charge injection into first dielectric material 104, as discussed in connection with FIG. 1, without requiring complete encapsulation of the isolator element. Second dielectric material 106 may have any suitable thickness which may prevent electrostatic charge injection into first dielectric material 104. For example, second dielectric material 106 may have a thickness in the range of 0.1 um to 1 um, or any value or range of values within that range.

Figure 3A:
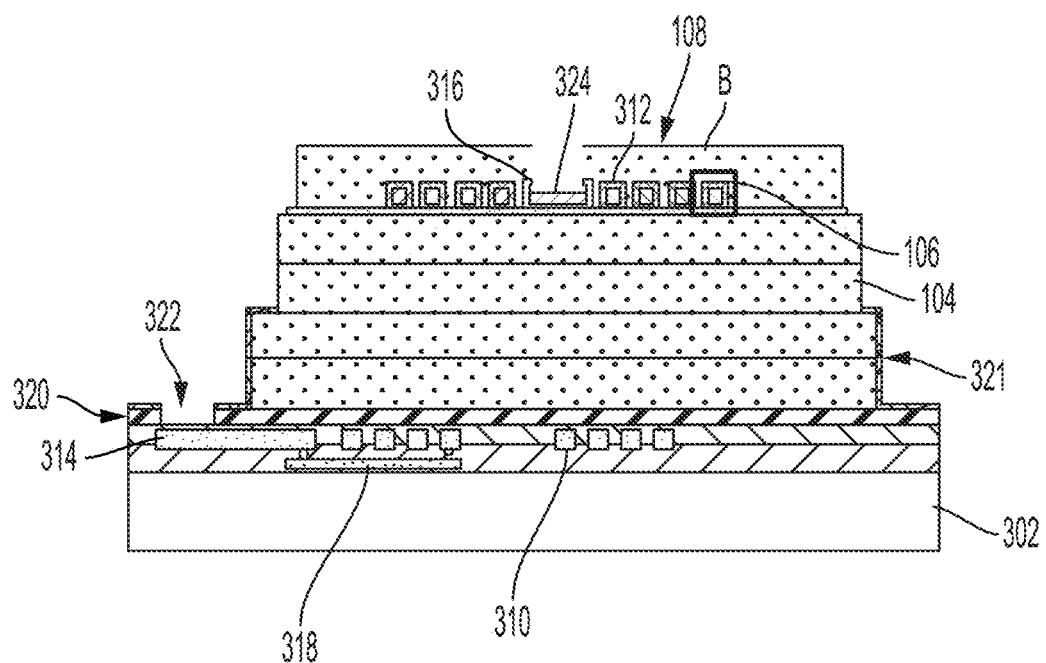
FIG. 3A illustrates a schematic view of an isolator having two isolator coil elements separated by a first dielectric material, with one of the isolator coil elements being encapsulated by a second dielectric material, in accordance with some embodiments.

As described above, according to an aspect of the present application, a micro-isolator is provided for isolating two circuits, the isolator including an isolator element comprising a coil and encapsulated by a wide bandgap material. FIG. 3A is a non-limiting example showing a cross-sectional view of micro-isolator 300 formed on substrate 102. The micro-isolator device 300 includes a first isolator element 310 comprising a coil disposed in the substrate 102 and covered with passivation layer 320. Passivation layer 320 may be formed of, as a non-limiting example, any one of silicon nitride, $SiO_2$, $Al_2O_3$, or $TaO_5$.

FIG. 3A shows, as a non-limiting example, electrically conductive elements which may electrically connect the first isolator element 310 to another device. First isolator element 310 may be electrically coupled to contact area 314 through electrical connection 318. Contact area 314 may allow for electrical coupling of another device to first isolator element 310. Electrical coupling to contact area 314 may be made through hole 322 in passivation layer 320. Electrical coupling to an external element (e.g., a circuit, device, chip) may be achieved through wire bonding, bump bonding, or any other suitable means of electrical coupling.

In accordance with some embodiments described herein, a first dielectric material 104 may be positioned between the passivation layer 320 and a second isolator element 312 comprising a coil. As shown in the illustrative example of FIG. 3A, first dielectric material 104 may be formed in a series of layers (e.g., in a series of deposition and thermal cure steps to increase the overall thickness of first dielectric material 104). It may be appreciated that any suitable number of layers may be formed, including a single layer or a number of layers other than four layers, as shown in the illustrative example of FIG. 3A.

In accordance with some embodiments described herein, a protective layer 321 may be formed over the passivation layer 320 and/or one or more layers of first dielectric material 104. Protective layer 321 may prevent mechanical damage to one or more components of the device and/or may act as a moisture barrier. Protective layer 321 may be formed of, for example, $Si_3N_4$, $SiO_2$, $Al_2O_3$, and/or $TaO_5$.

As in the example of FIG. 1, a second dielectric material 106 may completely or at least substantially encapsulate the coil elements of second isolator element 312. Second dielectric material 106 may prevent electrostatic charge from entering first dielectric material 104 from isolator element 312.

Additionally, in accordance with some embodiments, electrical contact may be made to the second isolator element 106. Hole 324 in dielectric layer 108 may provide access to contact area 316. Electrical coupling to second isolator element 312 may occur at contact area 316. Electrical connection to second isolator element 106 may be achieved through wire bonding, bump bonding, or any other suitable means of electrical coupling.

Figure 3B:
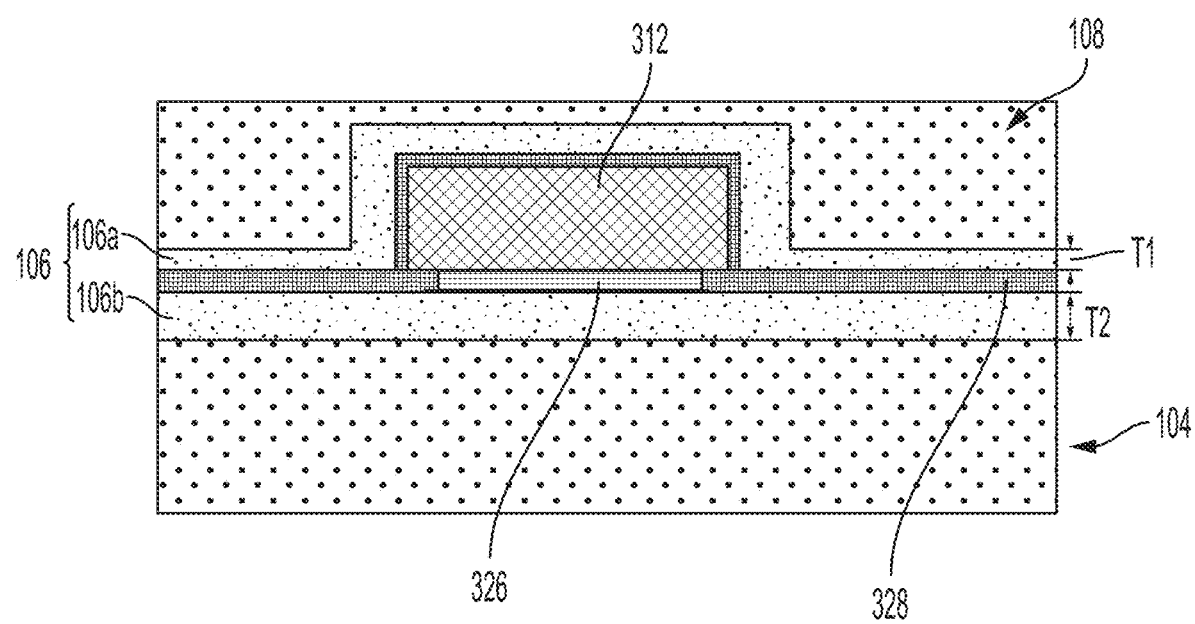
FIG. 3B illustrates a schematic view of a cross-section of an isolator coil element of FIG. 3A, in accordance with some embodiments.

According to an aspect of the present application, a micro-isolator comprises a dielectric material which may encapsulate an isolator element as well as one or more adhesion layers disposed between the isolator element and the dielectric material. FIG. 3B is a non-limiting example of an expanded, cross-sectional view of second isolator element 312 encapsulated in second dielectric material 106, as indicated by box B in FIG. 3A. In some embodiments, first adhesion layer 326 may be disposed below second isolator element 312 and above a lower portion 106b of second dielectric material 106. Second adhesion layer 328 may be disposed between the second isolator element 312 and an upper portion 106a of second dielectric material 106. First adhesion layer 326 and second adhesion layer 328 may be present in any one of previous or subsequent embodiments described herein.

According to an aspect of the present application, a first adhesion layer may assist in the bonding of the second isolator element 312 to the lower portion 106b of the second dielectric material 106. First adhesion layer 326 may assume any suitable configuration to assist in this bonding. In the non-limiting example shown, first adhesion layer 326 may be disposed under a portion of second isolator element 312. First adhesion layer may be disposed under the part of or the entirety of second isolator element 312. In some embodiments, first adhesion layer 326 may not be present. First adhesion layer 326 may assume any suitable thickness to assist in the bonding of second isolator element 312 to the lower portion 106b. For example, first adhesion layer 326 may have a thickness between 10 nm and 3000 nm, or any value or range of values within that range. First adhesion layer 326 may be composed of any suitable material to assist in the bonding of second isolator element 312 to the lower portion 106b. As a non-limiting example, first adhesion layer 326 may be formed of any one of Ti, W, Ta, Cr, Al, Cu, or TiW.

According to some embodiments, a second adhesion layer may assist in the bonding of upper portion 106a to the second isolator element 312. Second adhesion layer 328 may assume any suitable configuration. In the non-limiting example shown, second adhesion layer 328 may encapsulate second isolator element 312 and extend beyond second isolator element 312, separating upper portion 106a and lower portion 106b of second dielectric material 106. However, in some embodiments, second adhesion layer 328 may be disposed only such that it encapsulates second isolator element 312, or second adhesion layer 328 may not be present at all. Second adhesion layer 328 may assume any suitable thickness to assist in bonding upper portion 106a to second isolator element 312. For example, second adhesion layer 328 may have a thickness between 10 nm and 5000 nm, or any value or range of values within that range. Second adhesion layer 328 may be composed of any suitable material to assist in bonding upper portion 106a to second isolator element 312. As a non-limiting example, second adhesion layer 328 may be formed of any one of $Al_2O_3$, $SiO_2$, or $TiO_2$.

According to an aspect of the present application, the thicknesses of upper portion 106a and lower portion 106b may differ. As a non-limiting example, upper portion 106a and lower portion 106b may have different thicknesses T1 and T2 wherein T1 is thinner than T2. Thicknesses T1 and T2 may be between 10 nm and 5000 nm, or any value or range of values within that range. Changing thicknesses T1 and T2 may alter the electrostatic charge injection into first dielectric 104. Additionally, in some embodiments, upper portion 106a and lower portion 106b may be formed of the same dielectric material or they may be formed of different dielectric materials. As a non-limiting example, upper portion 106a and lower portion 106b may be formed of any combination of silicon nitride, $SiO_2$, and/or $Al_2O_3$.

Figure 3C:
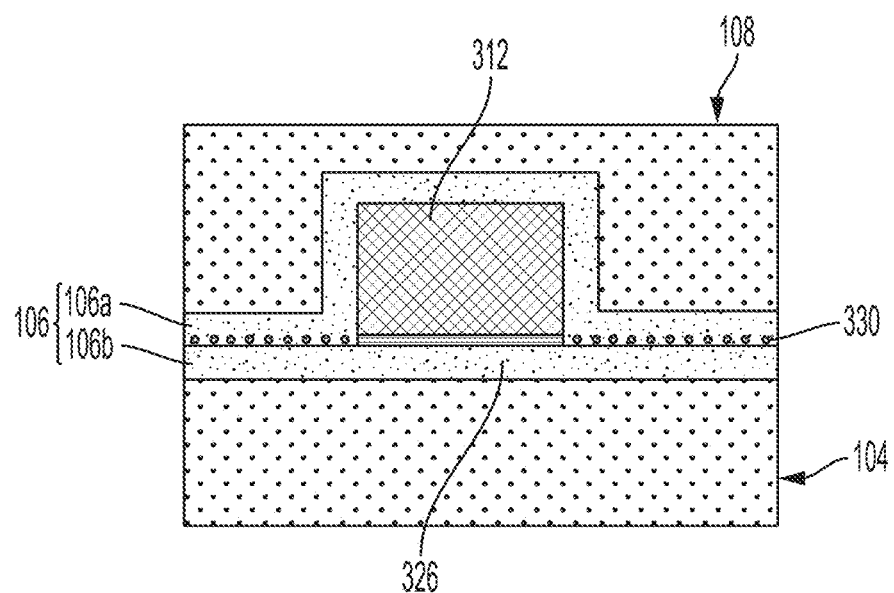
FIG. 3C illustrates a schematic view of a cross-section of an isolator coil element of FIG. 3A, in accordance with some embodiments.

According to an aspect of the present application, a micro-isolator comprises a dielectric material which may encapsulate an isolator element as well as one or more adhesion layers and/or nanoparticles disposed between the isolator element and the dielectric material. FIG. 3C is a non-limiting example of an expanded, cross-sectional view of second isolator element 312 encapsulated in second dielectric material 106, as indicated by box B in FIG. 3A. In some embodiments, a first adhesion layer 326 may be disposed below second isolator element 312 and above a lower portion 106b of second dielectric material 106. An upper portion 106a of second dielectric material 106 may be disposed above the lower portion 106b and the second isolator element 312.

According to an aspect of the present application, a layer of nanoparticles may be present within the second dielectric material 106. The nanoparticles 330 may be formed of the same material as the adhesion layer (e.g., Ti, W, Ta, Cr, Al, Cu, or TiW) and may have a diameter between 0.1 and 100 nm. Nanoparticles 330 may provide the isolator structure with field-grading properties such that conductivity in the second dielectric material 106 may be a function of the electric field. These properties may reduce the electric fields experienced at the edges of the second isolator element 312.

Additionally, while the example of FIG. 3C shows the nanoparticles 330 extending away from the second isolator element 312 to the edge of the pictured second dielectric material 106, the nanoparticles may alternatively be selectively removed (e.g., by a chemical or physical etch). Selectively removing nanoparticles 330 may leave spaces between individual coil elements of second isolator element 312 where there are no nanoparticles 330 present between the upper portion 106a and lower portion 106b of the second dielectric material 106. Selectively removing nanoparticles 330 may therefore alter the conductivity of the second dielectric material by removing a conductive path between the upper portion 106a and the lower portion 106b of the second dielectric material 106.

Figure 4:
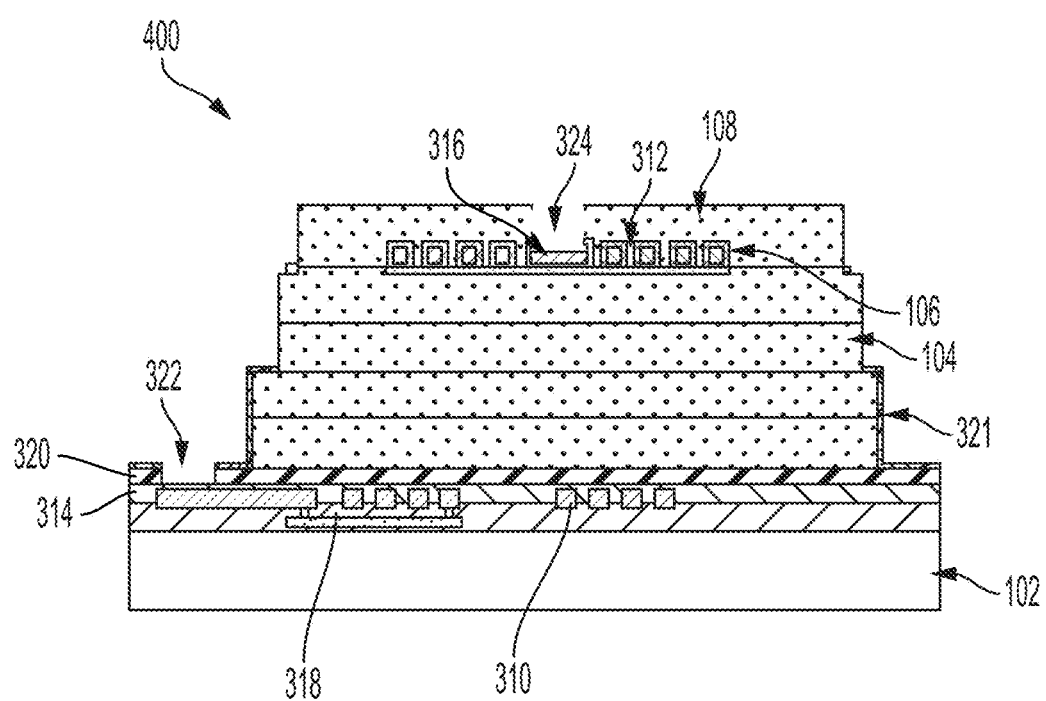
FIG. 4 illustrates a schematic view of an isolator having two isolator coil elements separated by a first dielectric material, with one of the isolator coil elements being encapsulated by a second dielectric material, in accordance with some embodiments.

According to an aspect of the present application, a micro-isolator comprises two different dielectrics between isolator elements comprising coils, with one dielectric encapsulating the second isolator element but not extending beyond the second isolator element. FIG. 4 is a non-limiting example, and differs from micro-isolator 300 of FIG. 3 in that the second dielectric material 106 is disposed under only the second isolator element rather than extending laterally from the second isolator element to one or more edges of first dielectric material 104. This configuration may prevent a conductive path from forming along the boundary between first dielectric material 104 and the another dielectric layer 108, and between the second isolator element 312 and the outer edge of the first dielectric material 104. Preventing this conductive path from forming may enhance the breakdown voltage of the micro-isolator 400.

Figure 5:
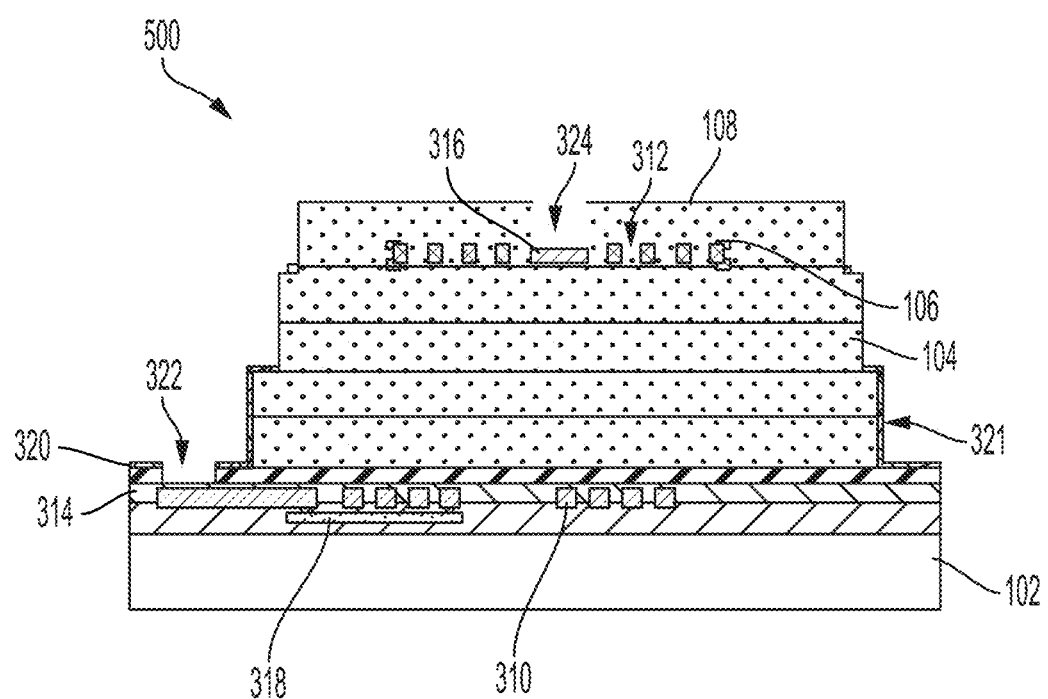
FIG. 5 illustrates a schematic view of an isolator having two isolator coil elements separated by a first dielectric material, with one of the isolator coil elements having outer corners covered by a second dielectric material, in accordance with some embodiments.

According to an aspect of the present application, a micro-isolator comprises two different dielectrics between isolator elements comprising coils, with one dielectric disposed at outer corners of a second isolator element. FIG. 5 is a non-limiting example, and differs from micro-isolator 300 of FIG. 3 and micro-isolator 400 of FIG. 4 in that the second dielectric material 106 is disposed only at the corners of second isolator element 312 rather than encapsulating all of second isolator element 312. Positioning second dielectric material 106 only at the corners of second isolator element 312 may also prevent the formation of a triple point junction and reduce electrostatic charge injection into first dielectric material 104 without completely encapsulating the isolator element. Restricting second dielectric material 106 to only the corners of second isolator element 312 may further reduce the likelihood of forming a conductive path along the boundary between first dielectric material 104 and the another dielectric layer 108, and between the second isolator element 312 and the outer edge of the first dielectric material 104.

Figure 6:
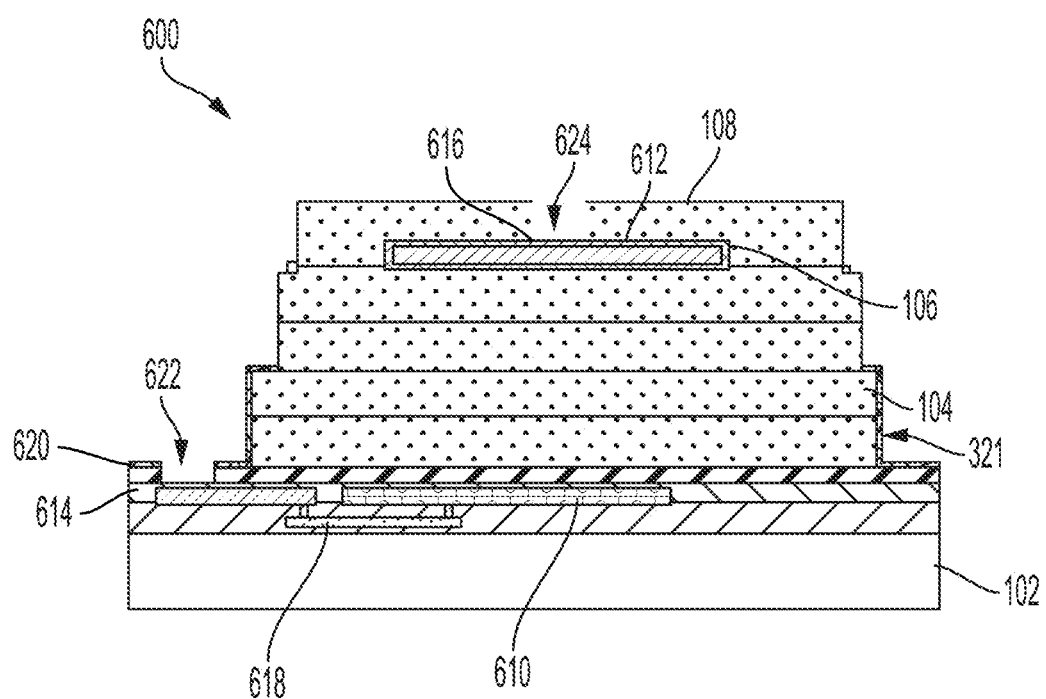
FIG. 6 illustrates a schematic view of an isolator having two isolator capacitive elements separated by a first dielectric material, with one of the isolator capacitive elements being encapsulated by a second dielectric material, in accordance with some embodiments.

According to an aspect of the present application, a micro-isolator comprises two different dielectrics between isolator elements comprising capacitive plates, with one dielectric encapsulating a second isolator element. FIG. 6 is a non-limiting example showing a cross-sectional view of micro-isolator 600 formed on substrate 102. The micro-isolator 600 may include a first isolator element 610 comprising a capacitive plate disposed in the substrate 102 and covered with passivation layer 620. Passivation layer 620 may be formed of, as a non-limiting example, any one of silicon nitride, $SiO_2$, $Al_2O_3$, or $TaO_5$.

FIG. 6 shows, as a non-limiting example, electrically conductive elements which may electrically connect the first isolator element 310 to another device. First isolator element 310 may be electrically coupled to contact area 614 through electrical connection 618. Contact area 614 may allow for electrical coupling of another device to first isolator element 610. Electrical coupling to contact area 614 may be made through hole 622 in passivation layer 620. Electrical coupling to an external element (e.g., a circuit, device, chip) may be achieved through wire bonding, bump bonding, or any other suitable means of electrical coupling.

In accordance with some embodiments described herein, a first dielectric material 104 may be positioned between the passivation layer 620 and a second isolator element 612 comprising a capacitive plate. The first and second isolator elements 610, 612 may be formed of any suitable material (e.g., Au, Al) and may have a thickness of 5 microns.

As in the example of FIG. 1, a second dielectric material 106 may completely or at least substantially encapsulate the capacitive plate elements of second isolator element 612. Second dielectric material 106 may be disposed only underneath the second isolator element 612 and may not extend to one or more outer edges of first dielectric material 104. Second dielectric material 106 may prevent electrostatic charge from entering first dielectric material 104 from isolator element 612.

Additionally, in accordance with some embodiments, electrical contact may be made to the second isolator element 106. Hole 624 in dielectric layer 108 may provide access to contact area 616. Electrical coupling to second isolator element 612 may occur at contact area 616. Electrical connection to second isolator element 106 may be achieved through wire bonding, bump bonding, or any other suitable means of electrical coupling.

Figure 7:
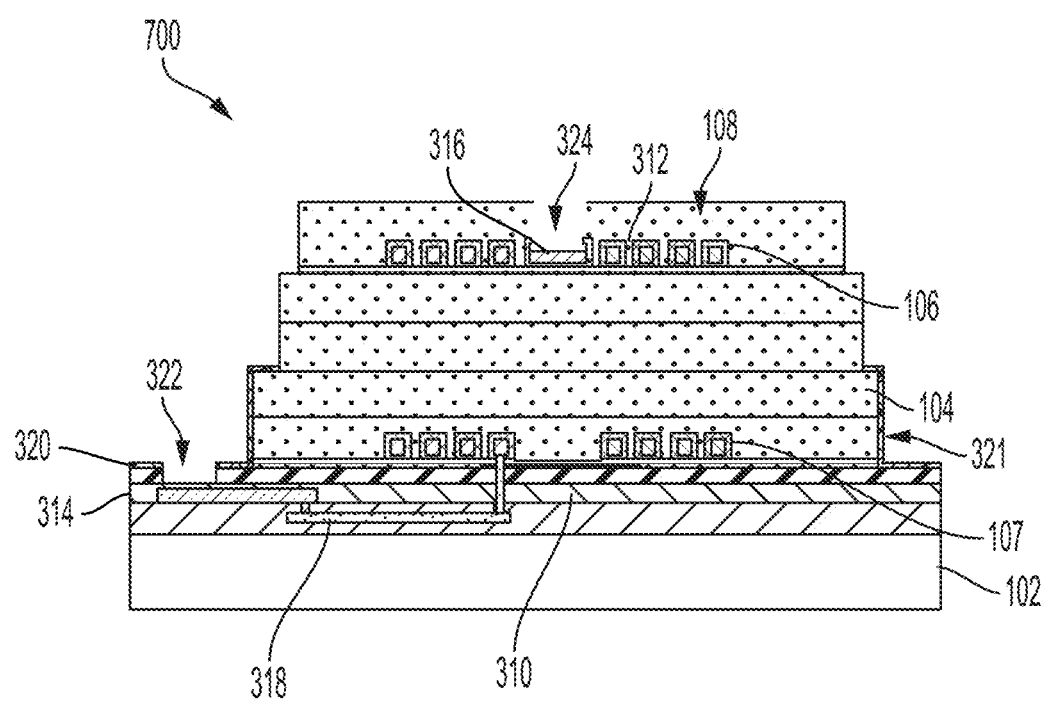
FIG. 7 illustrates a schematic view of an isolator having two isolator coil elements separated by a first dielectric material, with both of the isolator coil elements being encapsulated by a second dielectric material, in accordance with some embodiments.

According to an aspect of the present application, a micro-isolator comprises two different dielectrics between isolator elements comprising coils, with one dielectric encapsulating both isolator elements. FIG. 7 is a non-limiting example showing a cross-sectional view of micro-isolator 700 formed on substrate 102. In contrast to the example of FIG. 3, the first isolator element 310 may be disposed above the passivation layer 320 and within first dielectric material 104 in the example of FIG. 7. The first isolator element 310 may additionally be encapsulated in a second dielectric material 107 just as the second isolator element 312 may be encapsulated in a second dielectric material 106.

Second dielectric material 107 may assume any suitable configuration to prevent the formation of a triple point junction. In the non-limiting example shown, second dielectric material 107 may encapsulate, or substantially encapsulate the second isolator element 310 in order to prevent the formation of a triple point junction. However, other configurations of second dielectric material 107 are possible, some non-limiting examples of which are illustrated in previous figures. Second dielectric material 107 may extend across the entirety of first dielectric material 104 or it may only be disposed beneath first isolator element 310. Second dielectric material 107 may have any suitable thickness which may prevent electrostatic charge injection into first dielectric material 104. For example, second dielectric material 107 may have a thickness in the range of 0.1 um to 1 um, or any value or range of values within that range.

Second dielectric material 107 may comprise any suitable material which may prevent electrostatic charge injection into first dielectric material 104. For example, in some embodiments, second dielectric material 107 may be a material with a bandgap wider than the bandgap of first dielectric material 104. In some embodiments, second dielectric material 107 may be a material with a bandgap wider than 5.0 eV, some non-limiting examples of which include silicon nitride, $SiO_2$, and $Al_2O_3$. Additionally, second dielectric material 107 may be formed of the same material as second dielectric material 106, or may be formed of a different material than second dielectric material 107.

Figure 8:
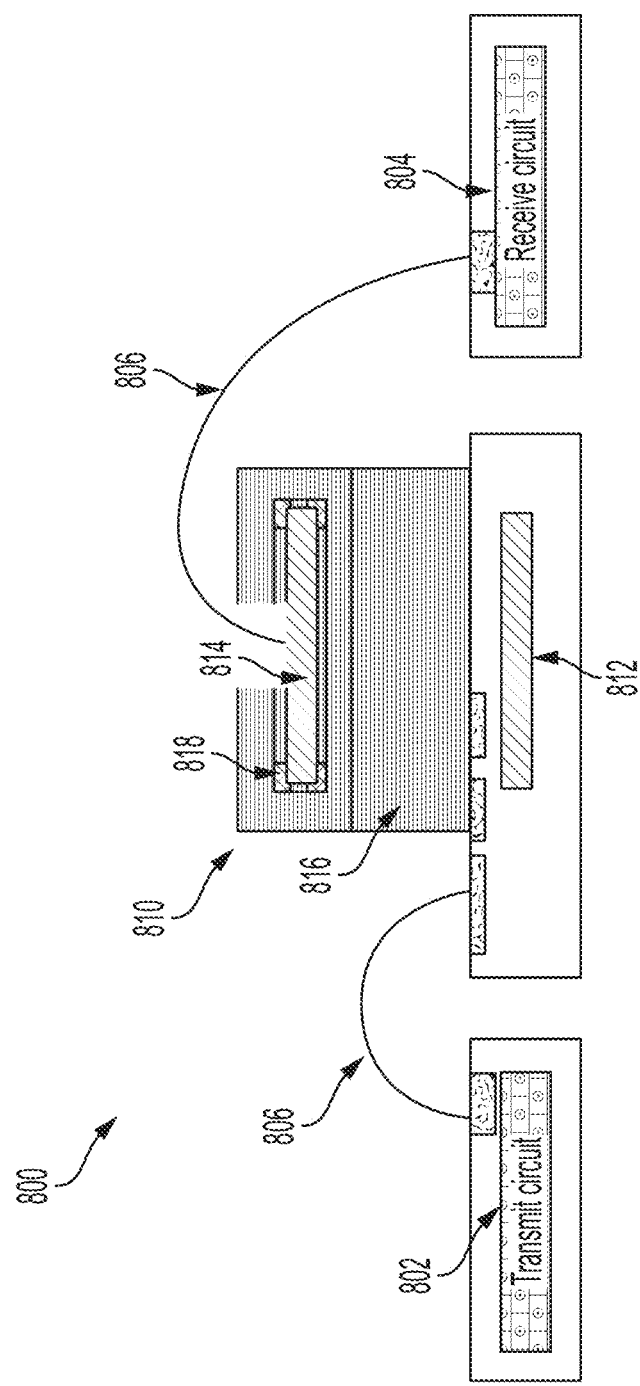
FIG. 8 illustrates a schematic view of an isolation system having a transmit circuit, a receive circuit, and an isolator having two isolator elements separated by a first dielectric material, with one of the isolator elements having corners covered by a second dielectric material, in accordance with some embodiments.

According to an aspect of the present application, an isolator system comprises a transmit and receive circuit communicatively coupled through a micro-isolator. FIG. 8 is a non-limiting example of a schematic of an isolation system 800. Isolation system 800 may include a transmit circuit 802 and a receive circuit 804 both coupled to micro-isolator 810 through, in this example, wire bonds 806. However, any suitable technique for forming electrical connections may be used to couple the transmit circuit 802 and the receive circuit 804 to the micro-isolator 810.

In the example of FIG. 8, micro-isolator 810 may comprise a first isolator element 812 and a second isolator element 814 separated by a first dielectric material 814. Second isolator element 814 is shown in this example as having a second dielectric material 818 disposed at its outer corners, though it may be appreciated that any embodiments described herein of an improved micro-isolator may be employed in isolation system 800.

In accordance with some embodiments described herein, isolation system 800 may include any suitable transmit and receive circuitry to transmit a signal across micro-isolator 810. Isolation system 800 may, for example, be a power transfer system and/or a data transfer system, and the transmit circuit 802 and receive circuit 804 may include suitable circuitry for transferring power and/or data signals. For example, transmit circuit 802 and receive circuit 804 may include modulation circuitry, driver circuitry, rectification circuitry, and/or feedback circuitry.

In some embodiments, an isolation system may be provided. The isolation system may comprise a transmission circuit, at least one micro-isolator coupled to the transmission circuit, and a receive circuit coupled to the at least one micro-isolator. The micro-isolator may include a first isolator element, a second isolator element, a first dielectric material between the first and second isolator elements, and a second dielectric material disposed at outer corners of the first isolator element. The second dielectric material may have a wider bandgap than the first dielectric material.

In some embodiments, the first dielectric material may comprise a polymer, and the second dielectric material may comprise a material with a bandgap greater than a bandgap of the first dielectric material. The second dielectric material may have a thickness between 0.1 and 5 microns and may be disposed within the first dielectric material.

In some embodiments, the first isolator element and the second isolator element may be at least one of coils or capacitive plates. The first isolator element may be further configured to operate at a first voltage, and the second isolator component may be configured to operate at a second voltage different than the first voltage. The receive circuit may be configured to operate at the first voltage, and the transmission circuit may be configured to operate at the second voltage.

Figure 9:
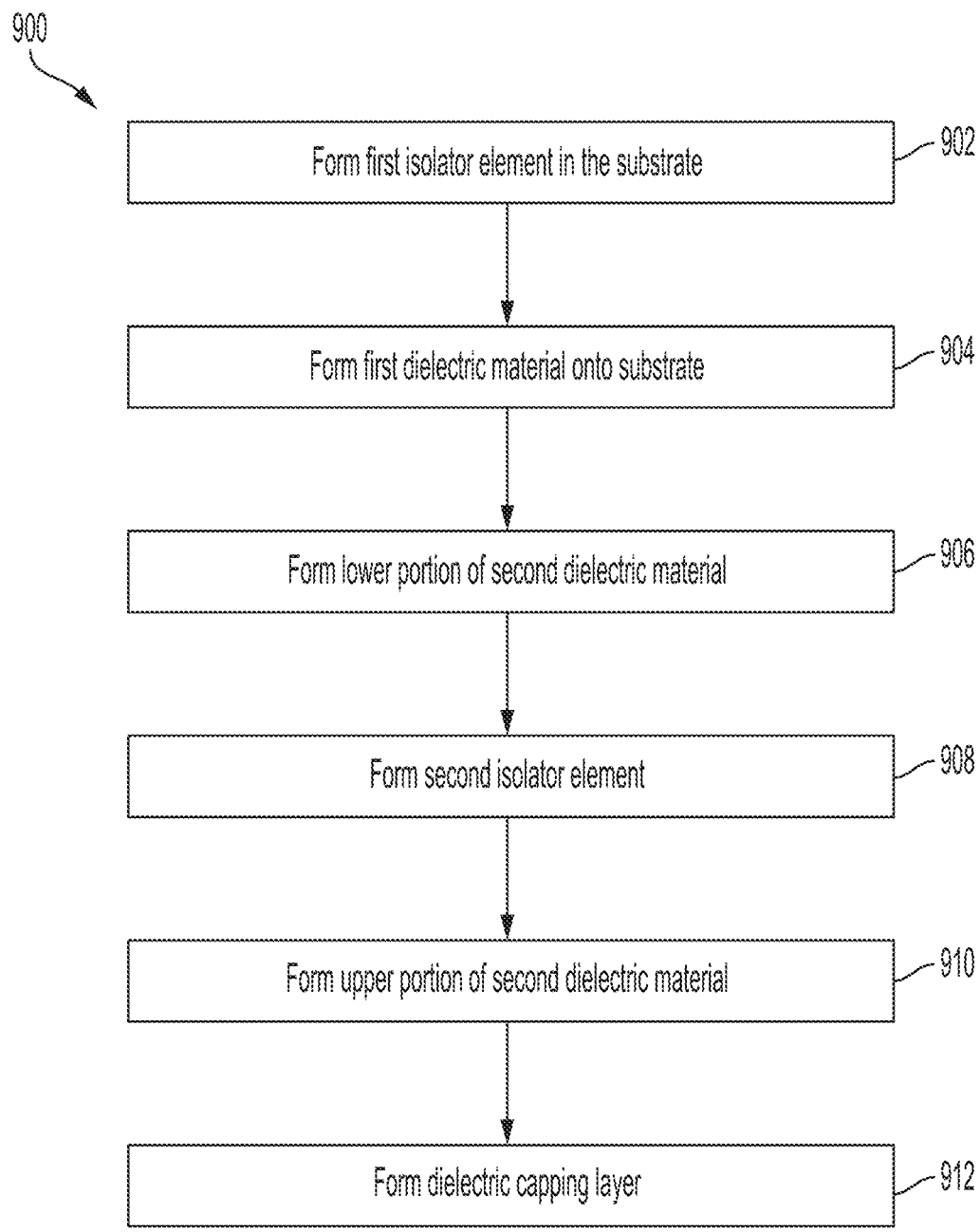
FIG. 9 is a flowchart of a method of fabricating an isolator device having two isolator elements separated by a first dielectric material, with one of the isolator elements being encapsulated by a second dielectric material, in accordance with some embodiments.

According to an aspect of the present application, a method of fabricating a micro-isolator device is described. FIG. 9 is a non-limiting example of a process 900 for fabricating a micro-isolator device, in accordance with some embodiments described herein. In act 902, a first isolator element may be formed in and/or on a substrate. The first isolator element may be formed by, for example, steps of patterning (e.g., lithography), etching, and/or depositing of materials (e.g., Au, Al, Cu) to form the first isolator element, as known to one skilled in the art. The first isolator element may be, for example, one of an inductive coil or a capacitive plate.

In accordance with some embodiments described herein, in act 902 one or more passivation layers may be formed over the isolator element. The passivation layers may be formed of any suitable materials such as, for example, $SiO_2$ and/or $Al_2O_3$. One or more holes may be formed through the passivation layers (e.g., by an etching process) to provide one or more locations through which electrical contact may be made to the first isolator element. Act 902 may be performed, for example, in a facility such as a semiconductor foundry.

In some embodiments, process 900 may then proceed to act 904 in which a first dielectric material is formed on the substrate. In some embodiments, the first dielectric material may be formed on the one or more passivation layers covering the substrate and/or first isolator element. The first dielectric material may also be formed directly on the substrate and/or first isolator element.

In accordance with some embodiments described herein, the first dielectric material may be formed in a same or different facility as the first isolator element, depending on the choice of dielectric material used. For example, the first dielectric material may be formed of a polymer such as polyimide, which can be formed outside of a typical semiconductor foundry environment. Reducing the number of steps of process 900 which may be performed in a semiconductor foundry environment may reduce the overall cost of manufacturing the micro-isolator device.

In accordance with some embodiments described herein, the first dielectric material may be deposited in one or more layers. There may be, for example, thermal curing steps in between layers to harden the first dielectric material. The thermal curing steps may require heating the first dielectric material to a temperature between 200° C. and 400° C. for a period of time between 1 and 10 hours in length. The first dielectric material may be deposited to form a layer with a thickness between 1 and 100 microns, in some embodiments.

In accordance with some embodiments described herein, the process 900 may then proceed to act 906 in which a lower portion of the second dielectric material may be formed. The lower portion of the second dielectric material may be formed of, for example, silicon nitride, $SiO_2$, and $Al_2O_3$. The lower portion may be formed in any suitable way known to those skilled in the art, and may depend on the material used. For example, the lower portion of the second dielectric material may be formed using one of a thermal evaporation process, a physical deposition process (e.g., sputtering), or a chemical vapor deposition process. The lower portion of the second dielectric material may be formed with a thickness between 0.1 and 5 microns.

In accordance with some embodiments described herein, the process 900 may then proceed to act 908, in which a second isolator element may be formed. The second isolator element may be formed by steps of patterning (e.g., lithography) and material deposition (e.g., thermal evaporation, sputtering, and/or chemical vapor deposition), as known to one skilled in the art. The second isolator element may be formed as, for example, one of an inductive coil or a capacitive plate.

In some embodiments, an adhesion layer may be formed between the lower portion of the second dielectric material and the second isolator element. The adhesion layer may be used to ensure adhesion between the second isolator element and the second dielectric material. The adhesion layer may be any one of, for example, Ti, W, Ta, Cr, Al, Cu, and/or TiW.

In accordance with some embodiments described herein, the process 900 may then proceed to act 910, in which an upper portion of the second dielectric material may be formed. The upper portion of the second dielectric material may be formed in a same or different way from the lower portion of the second dielectric material. For example, the upper portion of the second dielectric material may be formed of a different dielectric material than the lower portion or may be formed to a different thickness than the lower portion.

In some embodiments, an additional adhesion layer may be formed between the second isolator element and the upper portion of the second dielectric material. The additional adhesion layer may be formed to ensure adhesion between the upper portion of the second dielectric material and the second isolator element. The additional adhesion layer may be formed of, for example, one of $Al_2O_3$, $SiO_2$, and/or $TiO_2$.

In accordance with some embodiments described herein, the process 900 may then proceed to act 912, in which a dielectric capping layer may be formed. The dielectric capping layer may be formed of a dielectric material with a narrower bandgap than the second dielectric material. The dielectric capping layer may be formed of the same dielectric material as the first dielectric material or may be formed of a different dielectric material from the first dielectric material. For example, the dielectric capping layer may be formed of a polymer such as polyimide. Additionally, the dielectric capping layer may be deposited and then thermally cured in a same or similar manner as the first dielectric material It may be appreciated that the acts of process 900 may be suitably altered depending on the choice of materials. In some embodiments, it may be that the different acts are performed in different facilities and/or using different processes. Further, it may be appreciated that the acts may be performed in different orders or with other acts inserted between the described acts, depending on the embodiment. These choices of fabrication facilities and acts may lead to speed and/or cost benefits.

The integrated isolator devices described herein may be used in various applications (e.g., industrial, medical, consumer). For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be an integrated isolator device of any of the types described herein, and the isolated signal path may be analog or digital.

As another example, industrial equipment may be isolated from a control system controlling the equipment. For example, high wattage motors may be isolated from control systems controlling their operation by integrated isolator devices of the types described herein. The control systems may operate at a lower wattage than the high wattage motors used by the industrial equipment. The isolator may be disposed on a circuit board on which various circuit components connected to the motors and/or control equipment are included.

Other uses of the integrated isolator devices described herein are also possible, as those examples described are non-limiting.

As described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A micro-isolator with enhanced isolation breakdown voltage, comprising:
 a substrate;
 a first isolator element distal from the substrate;
 a second isolator element proximate the substrate;
 a first dielectric material, comprising a polymer, disposed between the first and second isolator elements; and
 a second dielectric material encapsulating the first isolator element.

2. The micro-isolator of claim 1, wherein the first dielectric material comprises polyimide and the second dielectric material comprises a material with a bandgap wider than a bandgap of the first dielectric material.

3. The micro-isolator of claim 1, wherein the first dielectric material has a thickness between 1 and 100 microns.

4. The micro-isolator of claim 1, wherein the second dielectric material has a thickness between 0.1 and 5 microns.

5. The micro-isolator of claim 1, wherein the first isolator element and the second isolator element are at least one of coils or capacitive plates.

6. The micro-isolator of claim 1, further comprising an adhesion layer between the first isolator element and the second dielectric material.

7. The micro-isolator of claim 1, wherein the second isolator element is disposed within the first dielectric material.

8. The micro-isolator of claim 1, wherein the first isolator element further comprises a first side and a second opposing side, and the second dielectric material is thinner on the first side of the first isolator element than on the second opposing side of the first isolator element.

9. A micro-isolator with enhanced isolation breakdown voltage, comprising:
 a first isolator element;
 a second isolator element;
 a first dielectric material disposed between the first and second isolator elements; and
 a second dielectric material comprising disconnected portions disposed at outer corners of the second isolator element, the second dielectric material having a wider bandgap than the first dielectric material.

10. The micro-isolator of claim 9, wherein the second dielectric material has a thickness between 0.1 and 5 microns.

11. The micro-isolator of claim 9, wherein the first isolator element and the second isolator element are at least one of coils or capacitive plates.

12. The micro-isolator of claim 9, further comprising an adhesion layer between the second isolator element and the second dielectric material.

13. The micro-isolator of claim 9, wherein the second isolator element is disposed within the first dielectric material.

14. A micro-isolator with enhanced isolation breakdown voltage, comprising:
 a first isolator element;
 a second isolator element;
 a first dielectric material disposed between the first and second isolator elements; and
 a second dielectric material encapsulating the first isolator element, wherein the second dielectric material does not extend laterally beyond a maximum lateral dimension of the first isolator element.

15. The micro-isolator of claim 14, wherein the first isolator element and the second isolator element are at least one of coils or capacitive plates.

16. The micro-isolator of claim 15, wherein the first isolator element comprises a coil, the coil comprising windings, and wherein each winding is separated from another winding by a gap in the second dielectric material.

17. The micro-isolator of claim 14, wherein the first dielectric material comprises a polymer and the second dielectric material comprises a material with a bandgap equal to or wider than a bandgap of the first dielectric material.

18. The micro-isolator of claim 14, wherein the second dielectric material has a thickness between 0.1 and 5 microns.

19. The micro-isolator of claim 14, wherein the second isolator element is disposed within the first dielectric material.

20. The micro-isolator of claim 9, wherein the first dielectric material comprises a polymer.

* * * * *